United States Patent
Blackmon et al.

(10) Patent No.: US 8,549,217 B2
(45) Date of Patent: Oct. 1, 2013

(54) SPACING PERIODIC COMMANDS TO A VOLATILE MEMORY FOR INCREASED PERFORMANCE AND DECREASED COLLISION

(75) Inventors: Herman Lee Blackmon, Moline, IL (US); Ronald Ernest Freking, Rochester, MN (US); Ryan Scott Haraden, Rochester, MN (US); Joseph Allen Kirscht, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 979 days.

(21) Appl. No.: 12/620,065

(22) Filed: Nov. 17, 2009

(65) Prior Publication Data

US 2011/0119439 A1    May 19, 2011

(51) Int. Cl.
    *G06F 12/00*    (2006.01)
(52) U.S. Cl.
    USPC .................................. 711/105; 711/E12.001
(58) Field of Classification Search
    None
    See application file for complete search history.

(56) References Cited

U.S. PATENT DOCUMENTS

| | | | |
|---|---|---|---|
| 4,887,240 A | 12/1989 | Garverick et al. | |
| 5,151,986 A | 9/1992 | Langan et al. | |
| 6,018,787 A | 1/2000 | Ip | |
| 6,157,990 A | 12/2000 | Randolph et al. | |
| 7,010,654 B2 | 3/2006 | Blackmon et al. | |
| 7,346,713 B2 | 3/2008 | Hillier, III et al. | |
| 2006/0106956 A1* | 5/2006 | Hillier et al. | 710/40 |
| 2008/0109598 A1 | 5/2008 | Schakel et al. | |

* cited by examiner

*Primary Examiner* — Denise Tran
(74) *Attorney, Agent, or Firm* — Matthew J. Bussan (57) ABSTRACT

A periodic command spacing mechanism is provided for spacing periodic commands (e.g., refresh commands, ZQ calibration, etc.) to a volatile memory (e.g., SDRAM, DRAM, EDRAM, etc.) for increased performance and decreased collision. In one embodiment, periodic command requests are monitored and if a collision is detected between two or more of the requests, the colliding requests are spaced with respect to one another by a timer offset applied on a chip select basis. The periodic command spacing mechanism may be used in conjunction with command arbitration to make sure the periodic commands are executed without significantly impacting performance (e.g., Reads and Writes are allowed to flow). Preferably, the periodic command requests are initialized by generating an initial sequence of individual requests, each successive request in the initial sequence being generated spaced apart with respect to the previous request by a timer offset applied on a chip select basis.

20 Claims, 4 Drawing Sheets

SPACING PERIODIC COMMANDS TO A
VOLATILE MEMORY FOR INCREASED
PERFORMANCE AND DECREASED
COLLISION

BACKGROUND OF THE INVENTION

1. Field of Invention

The present invention relates in general to the data processing field. More particularly, the present invention relates to a method, apparatus and computer program product for spacing periodic commands (e.g., refresh commands, ZQ calibration commands, etc.) to a volatile memory (e.g., SDRAM, DRAM, EDRAM, etc.) for increased performance and decreased collision.

2. Background Art

The charge in each memory cell of a dynamic random access memory (DRAM) and other types of volatile memory has a natural tendency to degrade into a lower energy-state. Consequently, such memory cells require periodic charge "refreshing" to maintain stored data.

When accessing any type of volatile memory (e.g., SDRAM, DRAM, EDRAM, etc.) that requires periodic refreshes of ranks or banks, it is difficult to adequately control when the refresh commands happen. Generally, there is a timer that expires when the refresh command must be sent to the corresponding memory. If there are multiple ranks and/or banks that require refreshes, the refresh commands tend to bunch together. This tendency to bunch together also occurs with respect to other periodic commands, such as ZQ calibration commands (i.e., the ZQ calibration short (ZQCS) command and/or the ZQ calibration long (ZQCL) command).

Typically, the problem of periodic commands bunching together is ignored. Ignoring the problem, however, is not without cost. In the case of refresh commands, for example, if there are many refreshes waiting to be sent to the memory by a memory controller, the memory controller can get bogged down and efficiency can decrease rapidly as the refreshes plug up the command flow. Performance of a given memory can drop to such an extent that there must be enhancements made. One of these enhancements is changing the arbitration of refreshes so they are a higher priority to be executed than other commands. This enhancement, however, can make matters worse as far as slowing down performance by not allowing Reads and Writes to flow.

It is known to stagger refresh commands for the purpose of solving a different problem, i.e., simultaneous refreshes can cause severe power supply glitches. For example, U.S. Pat. No. 4,887,240 to Garverick et al. teaches each successive refresh to multiple banks of a DRAM array is staggered by one clock period. This staggered refresh technique is employed in the Garverick et al. patent to avoid large power supply current spikes while minimizing the effect on memory access bandwidth. U.S. Patent Application Publication No. 2008/0109598 A1 to Schakel et al. discloses a method and apparatus for refresh management of memory modules. The Schakel et al. reference teaches that it is desirable to manage the application of refresh operations such that current draw and voltage levels remain within acceptable limits by generating staggered refresh commands. While staggering refresh commands solves the power supply glitch problem, staggering the refresh commands so that they occur at designated times introduces a performance issue similar to that noted above with respect to changing the arbitration of refreshes. Namely, Reads and Writes do not flow at the times designated for the staggered refresh commands.

Therefore, a need exists for an enhanced mechanism for managing periodic commands to a volatile memory.

SUMMARY OF THE INVENTION

According to the preferred embodiments of the present invention, periodic commands (e.g., refresh commands, ZQ calibration, etc.) to a volatile memory (e.g., SDRAM, DRAM, EDRAM, etc.) are spaced for increased performance and decreased collision. In one embodiment, periodic command requests are monitored and if a collision is detected between two or more of the requests, the colliding requests are spaced with respect to one another by a timer offset applied on a chip select basis. This periodic command spacing mechanism may be used in conjunction with command arbitration to make sure the periodic commands are executed without significantly impacting performance (e.g., Reads and Writes are allowed to flow). Preferably, the periodic command requests are initialized by generating an initial sequence of individual requests, each successive request in the initial sequence being generated spaced apart with respect to the previous request by a timer offset applied on a chip select basis.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED
EMBODIMENTS

1. Overview

In accordance with the preferred embodiments of the present invention, periodic commands (e.g., refresh commands, ZQ calibration, etc.) to a volatile memory (e.g., SDRAM, DRAM, EDRAM, etc.) are spaced for increased performance and decreased collision. In one embodiment, periodic command requests are monitored and if a collision is detected between two or more of the requests, the colliding requests are spaced with respect to one another by a timer offset applied on a chip select basis. This periodic command spacing mechanism may be used in conjunction with command arbitration to make sure the periodic commands are executed without significantly impacting performance (e.g., Reads and Writes are allowed to flow). Preferably, the periodic command requests are initialized by generating an initial sequence of individual requests, each successive request in the initial sequence being generated spaced apart with respect to the previous request by a timer offset applied on a chip select basis.

2. Detailed Description

Figure 1:
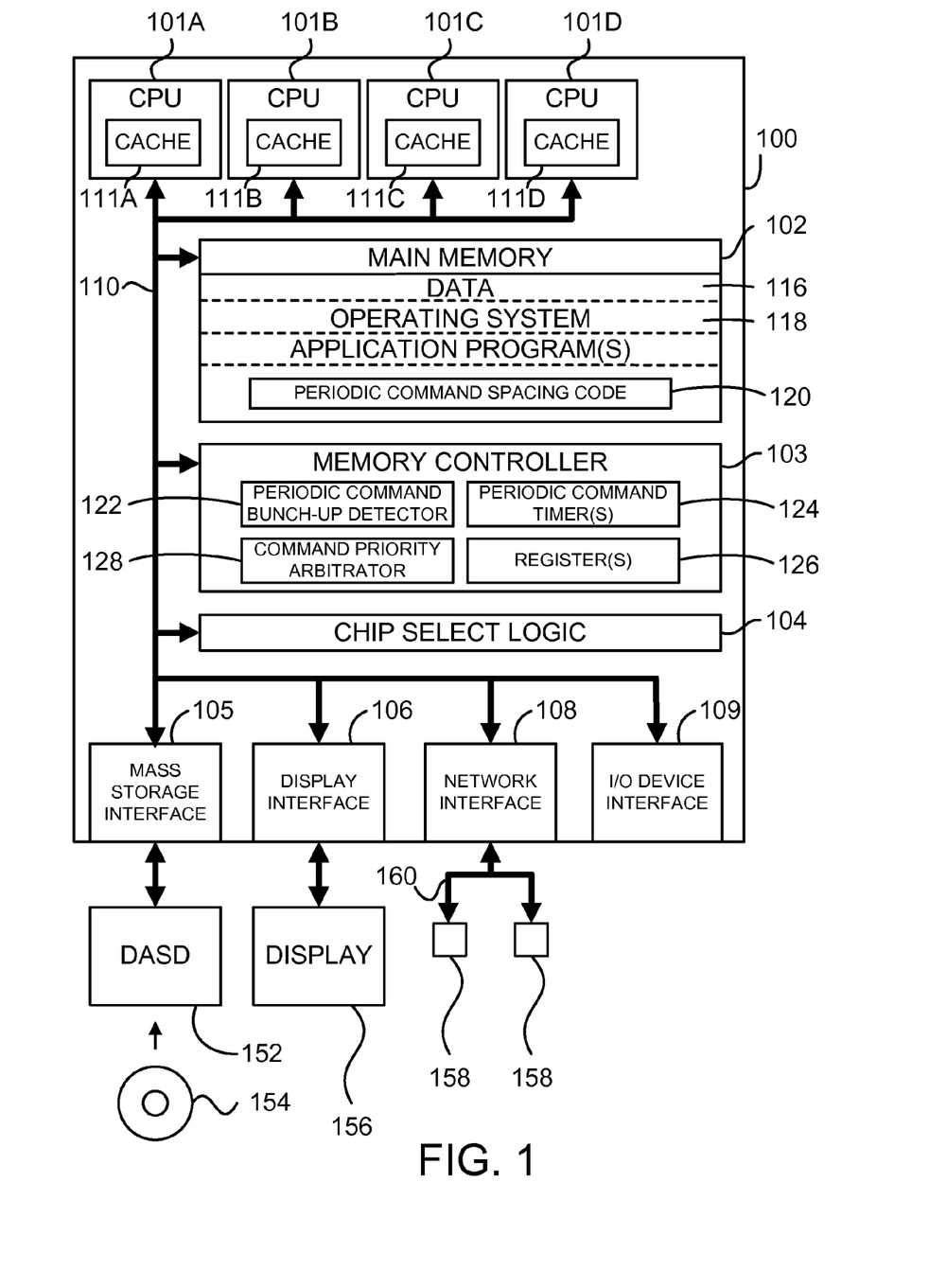
FIG. 1 is a block diagram illustrating a computer apparatus for implementing a mechanism for spacing periodic commands to a volatile memory for increased performance and decreased collision in accordance with the preferred embodiments of the present invention.

A computer system implementation of the preferred embodiments of the present invention will now be described with reference to FIG. 1 in the context of a particular computer system 100, i.e., an IBM eServer iSeries or System i computer system available from International Business Machines Corporation. However, those skilled in the art will appreciate that the method, apparatus, and computer program product of the present invention apply equally to any computer system, regardless of whether the computer system is a complicated multi-user computing apparatus (e.g., an IBM POWER6 processor-based server system or an IBM POWER6 processor-based blade system residing in an IBM BladeCenter chassis), a single user workstation, a PC, or an embedded control system. As shown in FIG. 1, computer system 100 comprises one or more processors 101A, 101B, 101C and 101D, a main memory 102, a memory controller 103, chip selection logic 104, a mass storage interface 105, a display interface 106, a network interface 108, and an I/O device interface 109. These system components are interconnected through the use of a system bus 110.

FIG. 1 is intended to depict the representative major components of computer system 100 at a high level, it being understood that individual components may have greater complexity than represented in FIG. 1, and that the number, type and configuration of such components may vary. For example, computer system 100 may contain a different number of processors than shown.

Processors 101A, 101B, 101C and 101D (also collectively referred to herein as "processors 101") process instructions and data from main memory 102. Processors 101 temporarily hold instructions and data in a cache structure for more rapid access. In the embodiment shown in FIG. 1, the cache structure comprises caches 111A, 111B, 111C and 111D (also collectively referred to herein as "caches 111") each associated with a respective one of processors 101A, 101B, 101C and 101D. For example, each of the caches 111 may include a separate internal level one instruction cache (L1 I-cache) and level one data cache (L1 D-cache), and level two cache (L2 cache) closely coupled to a respective one of processors 101. However, it should be understood that the cache structure may be different; that the number of levels and division of function in the cache may vary; and that the system might in fact have no cache at all.

Main memory 102 in accordance with the preferred embodiments contains data 116, an operating system 118 and application software, utilities and other types of software. In addition, the main memory 102 includes (in the embodiment illustrated in FIG. 1) periodic command spacing code 120, which represents any code that is employed in spacing periodic commands (e.g., refresh commands, ZQ commands, etc.) issued by memory controller 103 (or some other controller responsible for issuing periodic commands) to a volatile memory (e.g., main memory 102, cache 111, etc.) and which may in various embodiments reside elsewhere and in any number. Each of these entities in memory is described further below.

Although the periodic command spacing code 120 is illustrated as being contained within the main memory 102, in other embodiments some or all of this code may be on different electronic devices and may be accessed remotely (e.g., via the network 160).

While the periodic command spacing code 120 is shown in FIG. 1 as a separate entity in memory, the preferred embodiments expressly extend to the periodic command spacing code 120 being implemented within the operating system 118, application software, utilities, or other types of software within the scope of the preferred embodiments.

The periodic command spacing code 120 may comprise computer executable instructions maintained, for example, as a computer program product stored on a hard disk (e.g., on a DASD device 152), BIOS (basis input/output system), or system firmware. Firmware is "software" stored in a memory chip that holds its content without electrical power, such as, for example, read-only memory (ROM), programmable ROM (PROM), erasable programmable ROM (EPROM), electrically erasable programmable ROM (EEPROM), and nonvolatile random access memory (nonvolatile RAM).

In another embodiment, the periodic command spacing code 120 may be implemented in hardware via logic gates and/or other appropriate hardware techniques in lieu of, or in addition to, a processor-based system.

Memory controller 103 may include a controller for cache (e.g., cache 111), main memory 102 for the system 100, or other memory and may couple with memory via the data bus 110 to service commands to access the memory. Memory controllers generally provide an interface between the processors and the memory, typically determining latencies related to memory accesses for the processors. In particular, memory controllers are typically responsible for generating refresh commands and other periodic commands and accepting, e.g., load and store requests from the processors, interfacing with the memory to perform refresh and other periodic maintenance operations, as well as load and store operations, and, in the case of load operations, returning the data to the processors.

In accordance with the preferred embodiments of the present invention, the memory controller 103 contains a periodic command bunch-up detector 122, one or more periodic command timers 124, and one or more software programmable registers 126. The periodic command timer(s) 124 and register(s) 126, as described in detail below, in conjunction with the periodic command spacing code 120, serve to space periodic commands issued by memory controller 103 to the memory—when periodic command requests are initialized and/or in response to the periodic command detector 122 detecting collisions between two or more periodic command requests. In addition, the memory controller 103 may include a command priority arbitrator 128 to re-order commands to access the memory, including the periodic commands, based priorities and latencies associated with the commands such as the order in which the commands were received and the command types. Each of these entities in the memory controller 103 is described further below.

The command priority arbitrator 128 may be conventional. Examples of suitable conventional command priority arbitrators are disclosed in U.S. Pat. No. 7,010,654 B2, issued Mar. 7, 2006 to Herman L. Blackmon et al., entitled "METHODS AND SYSTEMS FOR RE-ORDERING COMMANDS TO ACCESS MEMORY" and U.S. Pat. No. 7,346,713 B2, issued Mar. 18, 2008 to Philip R. Hillier, III et al., entitled "METHODS AND APPARATUS FOR SERVICING COMMANDS THROUGH A MEMORY CONTROLLER PORT", each of which is hereby incorporated herein by reference in its entirety. On the other hand, the command priority arbitrator 128 may be non-conventional in that it may utilize a prioritization scheme optimized for use with the present invention.

As noted above in the "Background Art" section, it is not uncommon for conventional command priority arbitrators to be "enhanced" to prevent refresh commands from plugging up the command flow by granting refresh commands a higher priority to be dispatched than other commands. This "enhancement", however, can make matters worse as far as slowing down performance by not allowing Reads and Writes to flow. In accordance with the preferred embodiments of the present invention, the command priority arbitrator 128 may still grant refresh commands or other periodic commands a higher priority to be dispatched than certain other commands, but because the requests for refresh commands or other periodic commands are spaced apart relative to one another, Reads and Writes can flow more freely.

As also noted above in the "Background Art" section, while it is known to stagger refresh commands so that they occur at designated times, this introduces a performance issue similar to that just noted with respect to changing the arbitration of refresh commands. Namely, Reads and Writes do not flow at the times designated for the staggered refresh commands. However, in accordance with an embodiment of the present invention, requests for refresh commands or other periodic commands, while perhaps initially spaced apart relative to one another, may be dynamic enough in their timing as to allow two or more of the periodic command requests to bunch-up (at least, temporarily). For example, the prioritization scheme utilized by the command priority arbitrator 128 may allow the designated time for dispatch of a refresh command to be delayed to allow a Read or Write to flow. The bunching-up of the periodic command requests would then be detected, and subsequent iterations of the bunched-up periodic command requests would be again spaced apart with respect to one another.

Chip select logic 104 generates chip select signals by which various chips are enabled in the computer system 100. Conventional computer architectures define a data bus and an address bus (e.g., system bus 110) to which a variety of devices (e.g., processors 101, main memory 102, memory controller 103, mass storage interface 105, display interface 106, network interface 108, and I/O device interface 109, as well as plural status and control registers) are connected. Each of these devices is addressable from each of the processors 101 when the processor 101 puts the device's address in the address bus. Chip select logic 104 reads address information on the address bus and generates a chip select signal so as to enable the addressed device. This process defines a valid "chip select". For example, chip select logic 104 may generate a chip select signal enabling a respective one of the memory chips that comprise the main memory 102. The chip select logic 104 is described further below with reference to FIG. 2.

In accordance with the preferred embodiments of the present invention, the periodic command timer(s) 124 is/are implemented per chip select to increase the efficiency of spacing of the periodic commands. The periodic command timer(s) 124 and register(s) 126, as described in detail below, in conjunction with the periodic command spacing code 120, serve to space periodic commands issued by memory controller 103 to the memory—when periodic command requests are initialized and/or in response to the periodic command detector 122 detecting collisions between two or more periodic command requests. In each case, a timer offset set in the register(s) 126 is applied on a chip select basis to the periodic command timer(s) 124. The timer offset is preferably equal to a natural number integer multiple of Tx/N. Tx is a periodic time-out value associated with a given periodic command. For example, the periodic time-out value Tx may be the refresh period (tREF) for refresh commands. Refresh commands are provided to DRAM chips to refresh the memory cells of the memory cell banks and/or ranks that comprise each of the DRAM chips. Alternatively, the periodic time-out value Tx may be ½ the refresh period (tREF/2) when the refresh commands need to be performed more frequently. That is, the periodic time-out value Tx may be software programmable to accommodate a variable memory technology. N is the number of valid chip selects, i.e., the number of chip selects that are valid with respect to the given periodic command.

On the other hand, the periodic time-out value Tx may be the ZQ calibration long (ZQCL) time interval and/or the ZQ calibration short (ZQCS) time interval for ZQ calibration commands. ZQ calibration commands are provided to DRAM chips to calibrate an output driver impedance and/or an on-die termination (ODT) value of the memory cell of memory cell banks and/or ranks that comprise each of the DRAM chips.

The periodic command spacing code 120 may, for example, change value(s) set in register(s) 126 based on various information it receives, such as an update in the number of valid chip selects N or a change in the predetermined periodic time-out value Tx to accommodate a different memory technology.

Computer system 100 utilizes well known virtual addressing mechanisms that allow the programs of computer system 100 to behave as if they have access to a large, single storage entity instead of access to multiple, smaller storage entities such as main memory 102 and DASD device 152. Therefore, while data 116, operating system 118, and periodic command spacing code 120, are shown to reside in main memory 102, those skilled in the art will recognize that these items are not necessarily all completely contained in main memory 102 at the same time. It should also be noted that the term "memory" is used herein to generically refer to the entire virtual memory of the computer system 100.

Data 116 represents any data that serves as input to or output from any program in computer system 100.

Operating system 118 is a multitasking operating system known in the industry as IBM i (formerly IBM i5/OS); however, those skilled in the art will appreciate that the spirit and scope of the present invention is not limited to any one operating system.

Processors 101 may be constructed from one or more microprocessors and/or integrated circuits. Processors 101 execute program instructions stored in main memory 102. Main memory 102 stores programs and data that may be accessed by processors 101. When computer system 100 starts up, processors 101 initially execute the program instructions that make up operating system 118. Operating system 118 is a sophisticated program that manages the resources of computer system 100. Some of these resources are processors 101, main memory 102, memory controller 103, chip select logic 104, mass storage interface 105, display interface 106, network interface 108, I/O device interface 109 and system bus 110.

Although computer system 100 is shown to contain four processors and a single system bus, those skilled in the art will appreciate that the present invention may be practiced using a computer system that has a different number of processors and/or multiple buses. In addition, the interfaces that are used in the preferred embodiments each include separate, fully programmed microprocessors that are used to off-load compute-intensive processing from processors 101. However, those skilled in the art will appreciate that the present invention applies equally to computer systems that simply use I/O adapters to perform similar functions.

Mass storage interface 105 is used to connect mass storage devices (such as a direct access storage device 152) to computer system 100. One specific type of direct access storage device 152 is a readable and writable CD ROM drive, which may store data to and read data from a CD ROM 154.

Display interface 106 is used to directly connect one or more displays 156 to computer system 100. These displays 156, which may be non-intelligent (i.e., dumb) terminals or fully programmable workstations, are used to allow system administrators and users (also referred to herein as "operators" and "developers") to communicate with computer system 100. Note, however, that while display interface 106 is provided to support communication with one or more displays 156, computer system 100 does not necessarily require a display 156, because all needed interaction with users and processes may occur via network interface 108.

Network interface 108 is used to connect other computer systems and/or workstations 158 to computer system 100 across a network 160. The present invention applies equally no matter how computer system 100 may be connected to other computer systems and/or workstations, regardless of whether the network connection 160 is made using present-day analog and/or digital techniques or via some networking mechanism of the future. In addition, many different network protocols can be used to implement a network. These protocols are specialized computer programs that allow computers to communicate across network 160. TCP/IP (Transmission Control Protocol/Internet Protocol) is an example of a suitable network protocol.

The I/O device interface 109 provides an interface to any of various input/output devices.

At this point, it is important to note that while the description above is in the context of a fully functional computer system, those skilled in the art will appreciate that the periodic command spacing code 120 and the other software type entities described herein may be distributed as an article of manufacture (also referred to herein as a "computer program product") in a variety of forms, and the claims extend to all suitable types of computer-readable media used to actually carry out the distribution, including recordable type media such as floppy disks and CD-ROMs (e.g., CD ROM 154 of FIG. 1).

Embodiments herein may also be delivered as part of a service engagement with a client corporation, nonprofit organization, government entity, internal organizational structure, or the like. These embodiments may include configuring a computer system to perform some or all of the methods described herein, and deploying software, hardware, and web services that implement some or all of the methods described herein.

Figure 2:
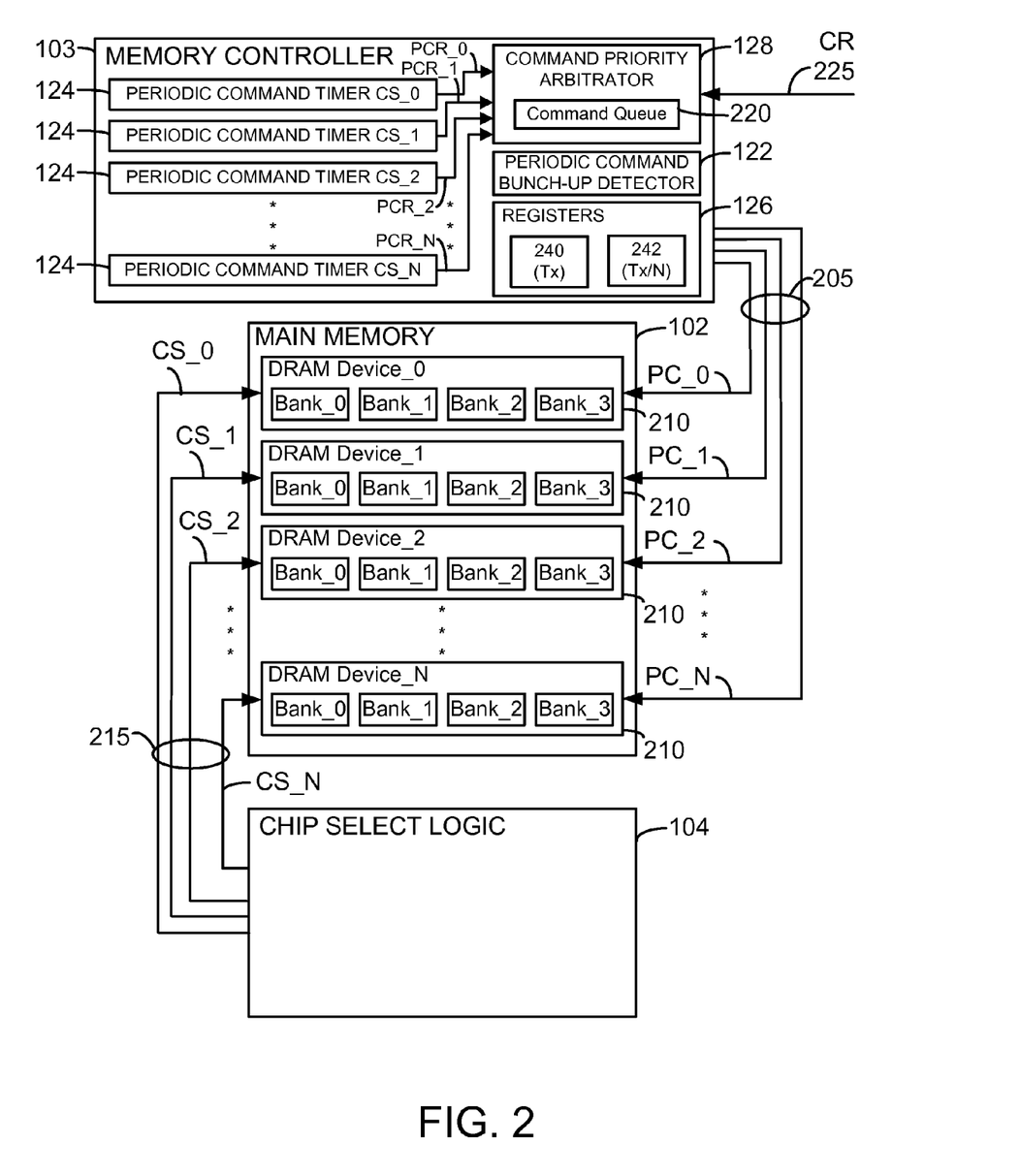
FIG. 2 is a block diagram illustrating the memory controller shown in FIG. 1 applying a timer offset to a periodic command timer on a chip select basis in accordance with the preferred embodiments of the present invention.

FIG. 2 is a block diagram illustrating the memory controller 103 shown in FIG. 1 applying a timer offset to periodic command timer(s) 124 on a chip select basis in accordance with the preferred embodiments of the present invention. The timer offset may be applied, for example, when a collision is detected between two or more periodic command requests. The timer offset also may be applied when initializing periodic command requests. For example, in the embodiment illustrated in FIG. 2, the timer offset may be applied when the periodic command requests PCR_0, PCR_1, PCR_2, . . . , and PCR_N are initialized and/or when the periodic command bunch-up detector 122 detects a collision between two or more of the periodic command requests PCR_0, PCR_1, PCR_2, . . . , and PCR_N. For example, the periodic command bunch-up detector 122 may detect that two or more periodic command requests PCR_0, PCR_1, PCR_2, . . . , and PCR_N are queued in a command queue 220 of the command priority arbitrator 128.

The periodic command requests PCR_0, PCR_1, PCR_2, . . . , and PCR_N may, for example, correspond to refresh command requests. However, those skilled in the art will appreciate that these periodic command requests may correspond to other requests for periodic commands, such as ZQ calibration commands and the like.

The main memory 102 comprises a plurality of memory chips, each respectively enabled by a chip select signal 215 from the chip select logic 104. In the embodiment illustrated in FIG. 2, the main memory 102 comprises N DRAM devices 210 (i.e., DRAM device_0, DRAM device_1, DRAM device_2, . . . , and DRAM device_N). These N DRAM devices 210 are respectively enabled by N chip select signals 215 (i.e., CS_0, CS_1, CS_2, . . . , and CS_N) sent from chip select logic 104. As illustrated in FIG. 2, each of the N DRAM devices 210 may include a plurality of memory banks (e.g., bank_0, bank_1, bank_2, . . . , bank_3) and/or ranks.

The memory controller 103 generates periodic command requests PCR_0, PCR_1, PCR_2, . . . , and PCR_N. These periodic command requests respectively request that periodic commands 205 (i.e., PC_0, PC_1, PC_2, . . . , and PC_N) be issued by the memory controller 103 to DRAM device_0, DRAM device_1, DRAM device_2, . . . , and DRAM device_N, respectively. The DRAM device_0, DRAM device_1, DRAM device_2, . . . , and DRAM device_N respectively correspond, as described further below, to chip selects CS_0, CS_1, CS_2, . . . , and CS_N.

To simplify the task of ensuring that all DRAM cells are properly refreshed, it is not uncommon for DRAM devices (including double data rate (DDR) and DDR2 synchronous DRAM (SDRAM) devices) to have an internal refresh row address register that keeps track of the row identification (ID) of the last refreshed row. Typically, a memory controller sends a single refresh command to the DRAM device. Subsequently, the DRAM device increments the row ID in the refresh row address register and executes a sequence of standard steps (typically referred to as a "row cycle") to refresh the data contained in the DRAM cells of all rows with the appropriate row ID's in all the banks in the DRAM device.

Typically, periodic command requests are generated by a memory controller and sent to a command priority arbitrator along with any other command requests received by the memory controller. For example, in the embodiment illustrated in FIG. 2, one or more command requests 225 (e.g., a load request and/or a store request) is/are received by the memory controller 103 and sent to command priority arbitrator 128 along with the periodic command requests PCR_0, PCR_1, PCR_2, . . . , and PCR_N. As is conventional, the command priority arbitrator 128 selects a command to issue to the memory 102 based upon priorities associated with the commands such as the order in which the command requests were received and the command types.

Periodic commands can get delayed as the result of collision or other reasons related to bandwidth. For example, a memory controller may delay issuing a periodic command to a memory because a collision occurs between the request for the periodic command and one or more other command requests. If periodic command requests bunch up, they can cause bandwidth problems by holding off data type commands for long periods of time. If, on the other hand, the periodic command requests could get spaced apart so this bunching does not happen again, bandwidth could be increased by not creating these collisions. When multiple periodic command requests come through at the same time, there should be something done so as to make sure it does not happen again. By changing the spacing in this case, then future collisions will be much less frequent. These observations of the inventors go to the heart of one of the aspects of the present invention, i.e., when collision between periodic command requests is detected the periodic command requests involved are spaced apart so this bunching does not happen again. Bandwidth can be increased by not allowing collision between these periodic command requests to recur.

As time goes by in a memory controller, periodic maintenance command requests can bunch together and plug up a memory port by causing data type command requests to get stalled behind them. By spacing these periodic command requests that happen at the same time, the present invention can prevent future collisions from being as frequent, or as harmful to bandwidth. When two or more of these periodic commands are being requested at the same time, the first periodic command for a chip select gets issued, then its timer starts at zero and counts to the predetermined periodic time-out value Tx set in a register. The next periodic command will then be issued for another chip select. Once this next periodic command is executed, its timer starts at a non-zero value. The non-zero value would be set in a register. For example, this register value may be equal to the periodic time-out value Tx divided by the number of valid chip selects N. So the second timer would start at this non-zero value Tx/N or whatever value the register is programmed to. Each chip select has a value in its timer offset by this value from another chip select. So, the timer associated with the periodic command request for chip select CS_0 would start at zero, the timer associated with the periodic command request for chip select CS_1 would start at Tx/N, the timer associated with the periodic command request for chip select CS_2 would start at 2*Tx/N, and so on. This will space out the periodic command requests decreasing the chance for collisions. Each timer counts from that timer's offset to the predetermined periodic time-out value Tx, plus that timer's offset.

Those skilled in the art will appreciate that the offset in the embodiment described above may be applied solely with respect to the two or more period commands that are being requested at the same time, or may be applied more generally to the periodic commands for all or a subset of the valid chip selects.

For example, with reference to FIG. 2, if periodic commands PC_0, PC_1 and PC_2 are being requested at the same time (i.e., period command requests PCR_0, PCR_1 and PCR_2 are generated at the same time), the first periodic command PC0 for a chip select CS_0 gets issued, then its timer 124 "PERIODIC COMMAND TIMER CS_0" starts at zero and counts to the periodic time-out value Tx set in a register 240. The next periodic command PC_1 for chip select CS_1 will then be issued. Once this next periodic command is executed, its timer 124 "PERIODIC COMMAND TIMER CS_1" starts at a non-zero value set in a register 242. For example, this register value may be equal to the periodic time-out value Tx divided by the number of valid chip selects N. So the second timer 124 "PERIODIC COMMAND TIMER CS_1" would start at this offset value Tx/N or whatever offset value the register 242 is programmed to. Each chip select has a value in its timer offset by this value from another chip select. So, the timer 124 "PERIODIC COMMAND TIMER CS_0" associated with the periodic command request for chip select CS_0 would start at zero (and count to Tx), the timer 124 "PERIODIC COMMAND TIMER CS_1" associated with the periodic command request for chip select CS_1 would start at Tx/N (and count to Tx+Tx/N), the timer 124 "PERIODIC COMMAND TIMER CS_2" associated with the periodic command request for chip select CS_2 would start at 2*Tx/N (and count to Tx+2*Tx/N), and so on. This will space out periodic command requests PCR_0, PCR_1 and PCR_2 decreasing the chance for collisions.

Preferably, the predetermined periodic time-out value Tx set in register 240 and the offset value Tx/N set in register 242 are programmable (e.g., via the periodic command spacing code 120 shown in FIG. 1).

Alternatively, or in addition to spacing out colliding periodic commands as described above, why not space the periodic commands before they have a chance to bunch up? This question goes to the heart of another aspect of the present invention, i.e., initializing periodic command requests in spaced apart fashion so that bunching is less likely to occur in the first place. In accordance with the preferred embodiments of the present invention, this is accomplished by making sure the periodic timer which tells the memory controller when to send a refresh to a given rank/bank of memory starts at a variable interval from any other rank/bank which is controlled by the same memory controller. This is a simple solution to the refresh performance problem, for example. This solution can be used in conjunction with high priority arbitration to make sure refreshes are executed without unduly impacting performance. This solution is better than just changing the priority because making refreshes high priority can make matters worse as far as slowing down performance by not allowing Reads and Writes to flow.

When the commands for memory DRAMs are initialized, refresh commands and other periodic commands must begin being executed to all valid chip selects. Refresh commands and other periodic commands must be issued periodically to make sure the DRAMs retain the information being stored on them. With many DRAMs it becomes problematic to have one periodic command timer for all DRAMs. And with variable technology, the periodicity of these commands varies. Accordingly, in accordance with the preferred embodiments of the present invention, a periodic command timer is implemented per chip select when the periodic commands are initialized to increase the efficiency of spacing the periodic commands.

When the periodic commands are initialized the first periodic command for a chip select gets issued, then its timer starts at zero and counts to the predetermined periodic time-out value Tx set in a register. The next periodic command will then be issued for another chip select. Once this next periodic command is executed, its timer starts at a non-zero value. The non-zero value would be set in a register. For example, this register value may be equal to the periodic time-out value Tx divided by the number of valid chip selects N. So the second timer would start at this non-zero value Tx/N or whatever value the register is programmed to. Each chip select has a value in its timer offset by this value from another chip select. So, the timer associated with the periodic command request for chip select CS_0 would start at zero, the timer associated with the periodic command request for chip select CS_1 would start at Tx/N, the timer associated with the periodic command request for chip select CS_2 would start at 2*Tx/N, and so on. Each timer counts from that timer's offset to the predetermined periodic time-out value Tx, plus that timer's offset. In this fashion, no chip select would have a timer set up to time-out at the same time as the timer of another chip select. This allows for less chance for collisions with periodic command requests. If all the periodic command requests are sent at once, any data type command request would be stalled until the periodic command was issued. If only one periodic command request is active for a given time interval, this decreases collision and increases bandwidth.

For example, with reference to FIG. 2, when the periodic commands are initialized the first periodic command PC0 for a chip select CS_0 gets issued, then its timer 124 "PERIODIC COMMAND TIMER CS_0" starts at zero and counts to the periodic time-out value Tx set in a register 240. The next periodic command PC_1 for chip select CS_1 will then be issued. Once this next periodic command is executed, its timer 124 "PERIODIC COMMAND TIMER CS_1" starts at a non-zero value set in a register 242. For example, this register value may be equal to the periodic time-out value Tx divided by the number of valid chip selects N. So the second timer 124 "PERIODIC COMMAND TIMER CS_1" would start at this offset value Tx/N or whatever offset value the register 242 is programmed to. Each chip select has a value in its timer offset by this value from another chip select. So, the timer 124 "PERIODIC COMMAND TIMER CS_0" associated with the periodic command request for chip select CS_0 would start at zero (and count to Tx), the timer 124 "PERIODIC COMMAND TIMER CS_1" associated with the periodic command request for chip select CS_1 would start at Tx/N (and count to Tx+Tx/N), the timer 124 "PERIODIC COMMAND TIMER CS_2" associated with the periodic command request for chip select CS_2 would start at 2*Tx/N (and count to Tx+2*Tx/N), and so on. This will space out periodic command requests PCR_0, PCR_1, PCR_2, . . . , and PCR_N decreasing the chance for collisions.

Figure 3:
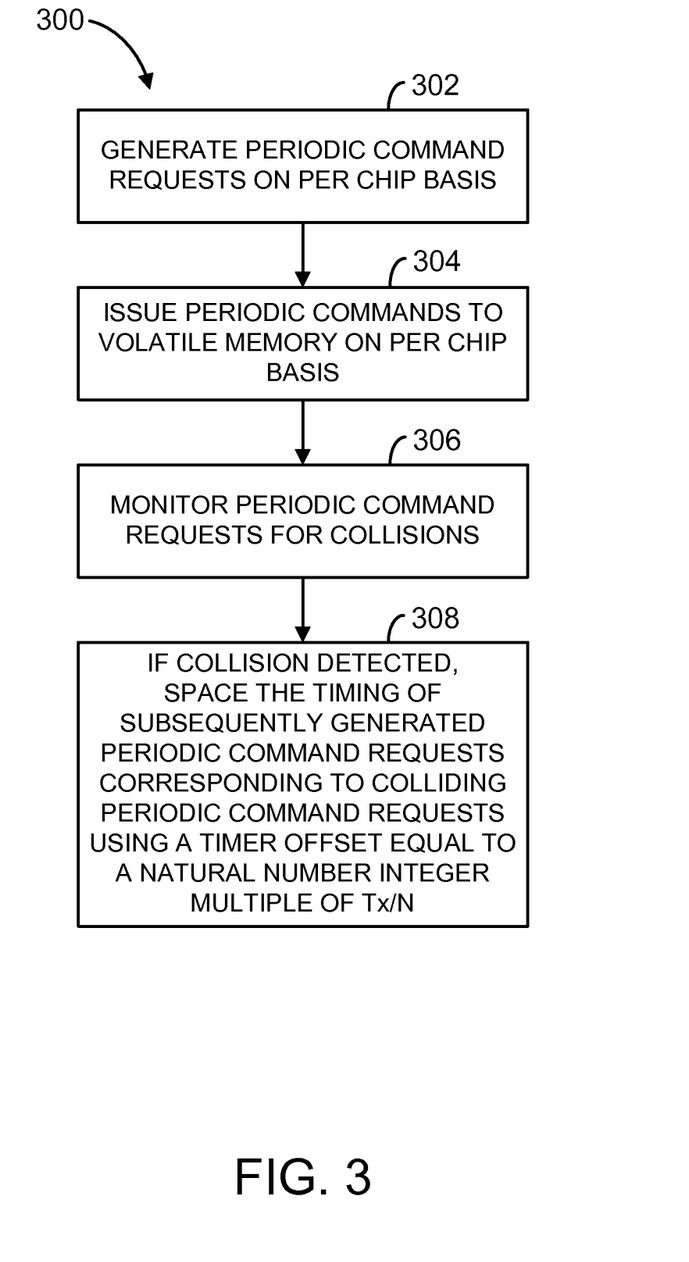
FIG. 3 is a flow diagram illustrating a method for spacing periodic commands to a volatile memory for increased performance and decreased collision in accordance with an embodiment of the present invention.

FIG. 3 is a flow diagram illustrating a method 300 for spacing periodic commands to a volatile memory for increased performance and decreased collision in accordance with an embodiment of the present invention. In the method 300, the steps discussed below (steps 302-308) are performed. These steps are set forth in their preferred order. It must be understood, however, that the various steps may occur at different times relative to one another than shown, or may occur simultaneously. Moreover, those skilled in the art will appreciate that one or more of the steps may be omitted.

The method 300 begins with the memory controller generating periodic command requests on a chip select basis (step 302). Each periodic command request generated in step 302 is based on a timer reaching a predetermined periodic time-out value. The periodic command requests generated in step 302 may have conventional timing. If so, two or more of the periodic command requests generated in step 302 may collide with each other already at this point. Alternatively, the periodic command requests generated in step 302 may be initialized so that successive individual periodic command requests are spaced apart by a timer offset, as described below with reference to step 402 in the embodiment shown in FIG. 4.

Next, the method 300 continues with the memory controller issuing periodic commands to a volatile memory on a chip select basis in response to the periodic command requests (step 304). In the step 304, the various command requests serviced by the memory controller, including the periodic command requests, may be arbitrated by a command priority arbitrator so as to re-order commands issued to the volatile memory in response to the command requests based on priorities associated with the commands. Accordingly, even if the periodic command requests do not collide with each other when generated in step 302, issuance of one or more periodic commands may be delayed by the command priority arbitrator in step 304 causing two or more of the periodic command requests to collide with each other.

The method 300 continues with the memory controller monitoring the periodic command requests for collisions between two or more of the periodic command requests (step 306). For example, a periodic command bunch-up detector of the memory controller may achieve this by, for example, detecting the presence of two or more periodic command requests in a command queue of the command priority arbitrator.

If a collision is detected between two or more of the periodic command requests in step 306, the method 300 continues with the memory controller spacing the timing of subsequently generated periodic command requests corresponding to the colliding periodic command requests (step 308). These subsequently generated periodic command requests are spaced apart with respect to one another by a timer offset applied on a chip select basis to the timer. The timer offset may, for example, equal a natural number integer multiple of Tx/N, where Tx is a predetermined periodic time-out value and N is the number of valid chip selects. This will space out subsequent iterations of the colliding periodic commands, thereby preventing future collisions from being as frequent, or as harmful to bandwidth.

The timer offset is preferably set in one or more registers in a programmable manner by the periodic command spacing code. The periodic command spacing code may, for example, change value(s) set in one or more registers based on information received from various components, such as an update in the number of valid chip selects N received from the chip select logic or a change in the predetermined periodic time-out value Tx to accommodate variable memory technology.

Figure 4:
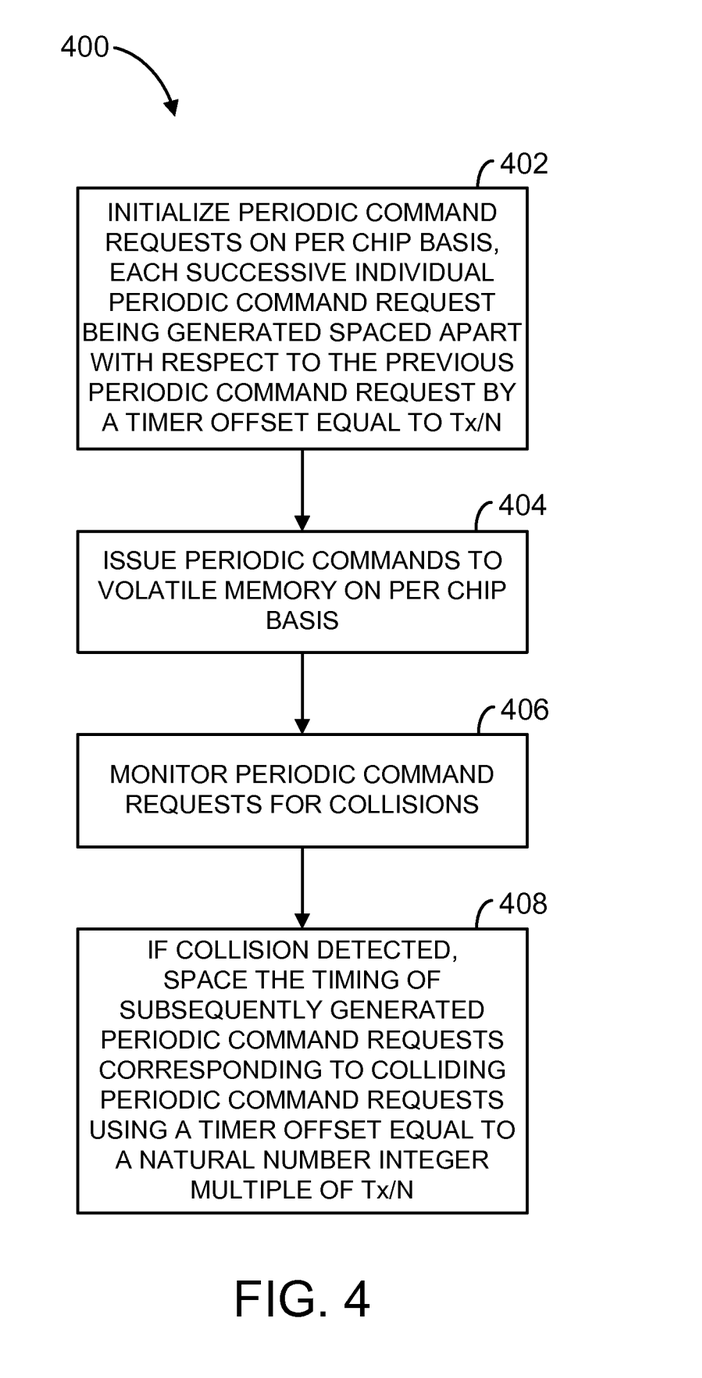
FIG. 4 is a flow diagram illustrating a method for spacing periodic commands to a volatile memory for increased performance and decreased collision in accordance with another embodiment of the present invention.

FIG. 4 is a flow diagram illustrating a method for spacing periodic commands to a volatile memory for increased performance and decreased collision in accordance with another embodiment of the present invention. In the method 400, the steps discussed below (steps 402-408) are performed. These steps are set forth in their preferred order. It must be understood, however, that the various steps may occur at different times relative to one another than shown, or may occur simultaneously. Moreover, those skilled in the art will appreciate that one or more of the steps may be omitted.

The method 400 shown in FIG. 4 is identical to the method 300 shown in FIG. 3, except for the initial step. The method 400 begins with the memory controller initializing periodic command requests on a chip select basis (step 402). Each successive individual periodic command request initialized in step 402 is generated spaced apart with respect to the previous periodic command request by a timer offset. The timer offset may, for example, equal Tx/N, where Tx is a predetermined periodic time-out value and N is the number of valid chip selects. This will space out all of the periodic command requests at initialization, thereby decreasing the chance for collisions to occur in the first place. If only one periodic command request is active for a given time interval, this decreases collision and increases bandwidth.

The timer offset is preferably set in one or more registers in a programmable manner by the periodic command spacing code. The periodic command spacing code may, for example, change value(s) set in one or more registers based on information received from various components, such as an update in the number of valid chip selects N received from the chip select logic or a change in the predetermined periodic time-out value Tx to accommodate variable memory technology.

Next, the method 400 continues with memory controller performing steps 404, 406 and 408, which are respectively identical to steps 304, 306 and 308 shown in FIG. 3.

One skilled in the art will appreciate that many variations are possible within the scope of the present invention. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. A computer system, comprising:
   at least one processor;
   a volatile memory comprising a plurality of memory chips;
   chip select logic operatively connected to the memory chips of the volatile memory, wherein the chip select logic generates a plurality of chip select signals each enabling a respective one of the memory chips of the volatile memory to define a chip select;
   a memory controller operatively connecting the at least one processor to the volatile memory, the memory controller performing the steps of:
      generating periodic command requests on a per chip select basis, wherein the timing of each periodic command request is based on a timer reaching a predetermined time-out value;
      issuing periodic commands to the volatile memory, the periodic commands being issued on a per chip select basis in response to the periodic command requests;
      monitoring the periodic command requests for collisions between two or more of the periodic command requests;
      if a collision is detected between two or more of the periodic command requests, spacing the timing of subsequently generated periodic command requests corresponding to the colliding periodic command requests so that the subsequently generated periodic command requests are spaced apart with respect to one another by a timer offset applied on a chip select basis to the timer.

2. The computer system as recited in claim 1, wherein the timer offset is equal to a natural number integer multiple of Tx/N, wherein Tx is a predetermined time-out value, and wherein N is the number of valid chip selects.

3. The computer system as recited in claim 2, wherein if a collision is detected between three periodic command requests respectively associated with chip selects CS0, CS1 and CS2, then the spacing step includes the steps of applying a timer offset equal to zero to the timer for the chip select CS0, applying a timer offset equal to Tx/N to the timer for the chip select CS1, and applying a timer offset equal to 2*Tx/N to the timer for the chip select CS2.

4. The computer system as recited in claim 1, wherein the issuing step includes the step of arbitrating command requests serviced by the memory controller, including the periodic command requests, so as to re-order commands issued to the volatile memory by the memory controller in response to the command requests based on priorities associated with the commands.

5. The computer system as recited in claim 1, wherein the generating step includes the step of initializing the periodic command requests by generating an initial sequence of individual periodic command requests, each successive individual periodic command request in the initial sequence being generated spaced apart with respect to the previous request by a timer offset applied on a chip select basis to the timer.

6. The computer system as recited in claim 5, wherein the timer offset applied in the initializing step is equal to Tx/N, wherein Tx is a predetermined time-out value, and wherein N is the number of valid chip selects.

7. The computer system as recited in claim 5, wherein the issuing step includes the step of arbitrating command requests serviced by the memory controller, including the periodic command requests issued subsequent to the initial sequence, so as to re-order commands issued to the volatile memory by the memory controller in response to the command requests based on priorities associated with the commands.

8. The computer system as recited in claim 1, wherein the volatile memory is dynamic random access memory (DRAM) comprising a plurality of DRAM chips each corresponding to a chip select and having memory cells subdivided into a plurality of memory cell banks and/or ranks, and wherein the periodic commands are refresh commands provided to the DRAM chips on a chip select basis to refresh the memory cells of the memory cell banks and/or ranks that comprise each of the DRAM chips.

9. The computer system as recited in claim 1, wherein the volatile memory is dynamic random access memory (DRAM) comprising a plurality of DRAM chips each corresponding to a chip select and having memory cells subdivided into a plurality of memory cell banks and/or ranks, and wherein the periodic commands are ZQ calibration commands provided to the DRAM chips on a chip select basis to calibrate at least one of an output driver impedance and an on-die termination (ODT) value of the memory cells of memory cell banks and/or ranks that comprise each of the DRAM chips.

10. A computer-implemented method for spacing periodic commands to a volatile memory comprising a plurality of memory chips, wherein chip select logic operatively connected to the memory chips of the volatile memory generates a plurality of chip select signals each enabling a respective one of the memory chips of the volatile memory to define a chip select, the computer-implemented method comprising the steps of:
   generating periodic command requests on a per chip select basis, wherein the timing of each periodic command request is based on a timer reaching a predetermined time-out value;
   issuing periodic commands to the volatile memory, the periodic commands being issued on a per chip select basis in response to the periodic command requests;
   monitoring the periodic command requests for collisions between two or more of the periodic command requests;
   if a collision is detected between two or more of the periodic command requests, spacing the timing of subsequently generated periodic command requests corresponding to the colliding periodic command requests so that the subsequently generated periodic command requests are spaced apart with respect to one another by a timer offset applied on a chip select basis to the timer.

11. The computer-implemented method as recited in claim 10, wherein the timer offset is equal to a natural number integer multiple of Tx/N, wherein Tx is a predetermined time-out value, and wherein N is the number of valid chip selects.

12. The computer-implemented method as recited in claim 11, wherein if a collision is detected between three periodic command requests respectively associated with chip selects CS0, CS1 and CS2, then the spacing step includes the steps of applying a timer offset equal to zero to the timer for the chip select CS0, applying a timer offset equal to Tx/N to the timer for the chip select CS1, and applying a timer offset equal to 2*Tx/N to the timer for the chip select C52.

13. The computer-implemented method as recited in claim 10, wherein the issuing step includes the step of arbitrating command requests serviced by the memory controller, including the periodic command requests, so as to re-order commands issued to the volatile memory by the memory controller in response to the command requests based on priorities associated with the commands.

14. The computer-implemented method as recited in claim 10, wherein the generating step includes the step of initializing the periodic command requests by generating an initial sequence of individual periodic command requests, each successive individual periodic command request in the initial sequence being generated spaced apart with respect to the previous request by a timer offset applied on a chip select basis to the timer.

15. The computer-implemented method as recited in claim 14, wherein the timer offset applied in the initializing step is equal to Tx/N, wherein Tx is a predetermined time-out value, and wherein N is the number of valid chip selects.

16. The computer-implemented method as recited in claim 14, wherein the issuing step includes the step of arbitrating command requests serviced by the memory controller, including the periodic command requests issued subsequent to the initial sequence, so as to re-order commands issued to the volatile memory by the memory controller in response to the command requests based on priorities associated with the commands.

17. The computer-implemented method as recited in claim 10, wherein the volatile memory is dynamic random access memory (DRAM) comprising a plurality of DRAM chips each corresponding to a chip select and having memory cells subdivided into a plurality of memory cell banks and/or ranks, and wherein the periodic commands are refresh commands provided to the DRAM chips on a chip select basis to refresh the memory cells of the memory cell banks and/or ranks that comprise each of the DRAM chips.

18. The computer-implemented method as recited in claim 10, wherein the volatile memory is dynamic random access memory (DRAM) comprising a plurality of DRAM chips each corresponding to a chip select and having memory cells subdivided into a plurality of memory cell banks and/or ranks, and wherein the periodic commands are ZQ calibration commands provided to the DRAM chips on a chip select basis to calibrate at least one of an output driver impedance and an on-die termination (ODT) value of the memory cells of memory cell banks and/or ranks that comprise each of the DRAM chips.

19. A computer program product for spacing periodic commands to a volatile memory, comprising:
a plurality of executable instructions provided on a non-transitory computer readable recordable media, wherein the executable instructions, when executed by a processor and/or a memory controller in a digital computing device, cause the digital computer device to perform the steps of:
generating periodic command requests on a per chip select basis, wherein the timing of each periodic command request is based on a timer reaching a predetermined time-out value;
issuing periodic commands to the volatile memory, the periodic commands being issued on a per chip select basis in response to the periodic command requests;
monitoring the periodic command requests for collisions between two or more of the periodic command requests;
if a collision is detected between two or more of the periodic command requests, spacing the timing of subsequently generated periodic command requests corresponding to the colliding periodic command requests so that the subsequently generated periodic command requests are spaced apart with respect to one another by a timer offset applied on a chip select basis to the timer.

20. The computer program product as recited in claim 19, wherein the timer offset is equal to a natural number integer multiple of Tx/N, wherein Tx is a predetermined time-out value, and wherein N is the number of valid chip selects.

* * * * *